US012656388B2

(12) United States Patent
Al-Karaghouli et al.

(10) Patent No.: US 12,656,388 B2
(45) Date of Patent: Jun. 16, 2026

(54) INSULATION MONITORING IN THE AC AIRCRAFT POWER DISTRICT

(71) Applicant: Hamilton Sundstrand Corporation, Charlotte, NC (US)

(72) Inventors: Ali Al-Karaghouli, Shirley (GB); Grzegorz Popek, Birmingham (GB)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 132 days.

(21) Appl. No.: 18/585,154

(22) Filed: Feb. 23, 2024

(65) Prior Publication Data
US 2024/0288485 A1 Aug. 29, 2024

(30) Foreign Application Priority Data
Feb. 23, 2023 (EP) ..................................... 23158312

(51) Int. Cl.
G01R 31/14 (2006.01)
(52) U.S. Cl.
CPC .................................... G01R 31/14 (2013.01)
(58) Field of Classification Search
CPC .............................. G01R 31/14; G01R 31/52
See application file for complete search history.

(56) References Cited

U.S. PATENT DOCUMENTS

| | | | | |
|---|---|---|---|---|
| 7,256,701 | B2 * | 8/2007 | Kono | G01R 31/343 340/648 |
| 8,541,962 | B2 | 9/2013 | Sato et al. | |

| | | | | |
|---|---|---|---|---|
| 9,577,424 | B2 | 2/2017 | Campbell | |
| 9,797,955 | B2 | 10/2017 | Okada et al. | |
| 10,256,713 | B2 | 4/2019 | Fukuda et al. | |
| 10,591,937 | B2 | 3/2020 | Dubois et al. | |
| 11,402,436 | B2 * | 8/2022 | Hu | G01R 31/52 |
| 11,754,638 | B2 * | 9/2023 | Lin | H02J 9/061 702/58 |
| 2005/0068000 | A1 | 3/2005 | Yamada et al. | |

(Continued)

FOREIGN PATENT DOCUMENTS

| | | | |
|---|---|---|---|
| JP | 2007159289 A * | 6/2007 | |
| WO | 2022009740 A1 | 1/2022 | |

OTHER PUBLICATIONS

Abstract for JP2007159289 (A), Published: Jun. 21, 2007, 1 page.
European Search Report for Application No. 23158312.1, mailed Aug. 10, 2023, 9 pages.

*Primary Examiner* — Thai T Dinh
(74) *Attorney, Agent, or Firm* — CANTOR COLBURN LLP

(57) ABSTRACT

A method for monitoring insulation in a power system comprising a motor drive circuit configured to provide AC power from a power source to power a motor. The method includes: boosting a DC link voltage of an inverter of the motor drive by an active rectifier, the active rectifier converting the AC power from the power source to DC power for the inverter; isolating the motor drive circuit from the power source; performing at least one isolation test by providing a current path through components of the motor drive and optionally a motor connected to the output of the inverter to be tested; monitoring the current during each isolation test to detect partial discharge or excessive leakage from the current path, thereby indicating that there exist one or more defect(s) in the insulation in the current path.

14 Claims, 2 Drawing Sheets

(56) References Cited

U.S. PATENT DOCUMENTS

| 2005/0151658 | A1* | 7/2005 | Kono | B60L 3/0023 |
| | | | | 324/541 |
| 2006/0158197 | A1 | 7/2006 | Horikoshi et al. | |
| 2008/0094022 | A1 | 4/2008 | Horikoshi et al. | |
| 2012/0112757 | A1 | 5/2012 | Vrankovic et al. | |
| 2012/0212172 | A1 | 8/2012 | Valdez et al. | |
| 2013/0141957 | A1 | 6/2013 | Tanaka | |
| 2021/0325478 | A1* | 10/2021 | Hu | G01R 31/42 |

* cited by examiner

INSULATION MONITORING IN THE AC AIRCRAFT POWER DISTRICT

CROSS REFERENCE TO RELATED APPLICATIONS

This application claims priority to European Patent Application No. 23158312.1 filed Feb. 23, 2023, the entire contents of which is incorporated herein by reference.

FIELD

This invention relates to the monitoring of insulation within a power system.

BACKGROUND

Power districts form a part of aircraft's power distribution. Each power district can consist of a power rack with multiple AC fed inverters, of which outputs can be multiplexed and/or paralleled by a switching matrix to drive various loads (e.g. electric motors). Within such systems, as with many electrical systems, wires, motor windings and the like should be electrically insulated so as to avoid unwanted electrical discharge.

As is particularly apparent in aircraft systems, any insulation has to be resistant to environmental constrains. For example, at high altitudes, the decreased air pressure leads to a reduced threshold for corona discharges (electrical discharges caused by the ionization of a fluid, such as air, surrounding a charged conductor). Furthermore, within aircraft there may be various corrosive chemicals, extreme temperatures, and the like which can lead to the degradation of insulation. This, combined with new, challenging design paradigms that have lead to an increased power density and efficiency within aircraft (e.g. high voltages and wide band gap devices like SiC), means that insulation within aircraft power systems remains of utmost importance.

Recently, there has been developments to utilize high voltage (e.g. voltages of 1000v or higher) power systems in aircraft, to allow for increasing power demand on board of aircraft. Such systems may have no de-rating standards, little to no empirical data and no in-service reliability information on insulation subjects in low pressure environments. This makes it difficult to design suitable, reliable systems for use in such situations. The use of high voltage exacerbates the issues outlined above, and can lead to an increased occurrence of unwanted discharges, and potential catastrophic failure.

The degradation of the condition of insulation can raise long term reliability concerns and, in the field of aircraft, can lead to hard or intermittent faults in aircraft protection systems. These issues can lead to long investigations and result in unscheduled maintenance, which can result in aircraft being grounded for an extended period of time. Additionally, whilst minor faults may not lead to the requirement of taking aircraft out of service, it is desirable to identify such faults as early as possible, such that they may be fixed during scheduled maintenance, and before they cause more major failures.

In order to mitigate such problems, it is possible to simply add excessive insulation to the cables and windings where insulation is necessary. However, such a solution adds undesirable weight, which should be minimised in aircraft applications.

SUMMARY

From a first aspect, there is provided a method for monitoring insulation in a power system comprising a motor drive circuit configured to provide AC power from a power source to power a motor, the method comprising: boosting a DC link voltage of an inverter of the motor drive by an active rectifier, the active rectifier converting the AC power from the power source to DC power for the inverter; isolating the motor drive circuit from the power source; performing at least one isolation test by providing a current path through components of the motor drive and optionally a motor connected to the output of the inverter to be tested; monitoring the current during each isolation test to detect partial discharge or excessive leakage from the current path, thereby indicating that there exist one or more defect(s) in the insulation in the current path.

Thus it will be seen that, in accordance with examples of the disclosure, that isolation that is present within a motor drive and/or anything connected to the output of the motor drive may be routinely tested, before failure. The method may utilise an inverter topology to direct current through relevant portions of the power systems that are to be monitored.

The step of boosting the DC link voltage may comprise controlling the active rectifier to perform a boost operation, thereby converting the AC power from the power source at its input to high voltage DC power at its output, thereby providing a boosted DC link voltage for the inverter of the motor drive. In this way, the active rectifier may be utilised to boost the voltage to a level that reflects the operating level of the power system, and thereby accurately determine whether there is or will be any faults in the insulation during normal operation.

The step of isolating the motor drive circuit from the power source may comprise turning off bidirectional switches on each leg of the active rectifier during a zero current demand resulting from the boosting of the DC link voltage.

The method may further comprise the steps of storing the monitored current during each isolation test; and using the stored current to predict the remaining life or present state of the insulation of the current path associated with each isolation test. In this way, the state of the insulation may be tracked over time to give an early indication of failure, or the information may be used to schedule a maintenance to address any issues that may be forming with relation to the insulation.

The step of monitoring the current during each isolation test may comprise: measuring the current on a low voltage DC rail, HVDC−, by closing a first switch thereby allowing current to pass through a first current monitoring circuit (6a), and/or measuring the current on a high voltage DC rail, HVDC+, by closing a second switch thereby allowing current to pass through a second current monitoring circuit. The switches allow for a reference point through which the current may flow, thereby allowing the current measurement circuits to measure for leakage, wherever appropriate.

The step of performing at least one isolation test comprises at least one of: testing the insulation of the inverter top switches and the active rectifier; testing the insulation of inverter bottom switches, windings of the motor and the harness of the winding; or testing the insulation of the active rectifier. This may be effected by controlling the switches of an inverter in a known fashion so as to direct current through components of interest, and measuring leakage therethrough-thereby giving an indication of any insulation faults on those chosen components. The presence of various separate tests may allow for the exact source of leakage to be accurately identified, and therefore reduce time required in scheduled maintenance to identify any errors.

The motor drive may be a first motor drive of a plurality of motor drives, and each of the plurality of motor drives may be connected to at least one of a plurality of motors via a reconfiguration matrix, and wherein the reconfiguration matrix may connect a desired motor drive of the plurality of motor drives to the output of the first motor drive such that the insulation of the desired motor drive may be tested. In this way, a single motor drive that is configured to perform such testing may be used to not only test insulation of itself (and one or more motors which it powers), but it may equally be able to test the insulation of other motor drives that are provided in a multiplexed control system.

From a second aspect, there is provided a motor drive that is suitable for performing any of the methods detailed above. The motor drive comprises: an active rectifier configured to connect to an AC power source at its input, and provide DC power along a high voltage DC rail, HVDC+, and a low voltage DC rail, HVDC−, at its output; an inverter configured to convert DC power across HVDC+ and HVDC− to an AC power output; an output capacitor network circuit connected to the output of the active rectifier, the capacitor network circuit being configured to operate as local energy storage and voltage balancing for the inverter; a first current monitoring circuit connected to HVDC−; and a second current monitoring circuit connected to HVDC+.

Such a motor drive may be able to carry out the above methods, such that it is provided with the ability to self-diagnose, or predict whether there may be an impending failure in its isolation, or equally in the isolation of any other motor drives/motors that may be connected thereto.

The inverter module may be based on IGBTs, Mosfet SiC, Si devices or relays.

The motor drive may comprise an EMC filter configured to filter input DC power, and/or a first switch in series with the first current monitoring circuit, and a second switch in series with the second current monitoring circuit.

The motor drive may further comprise at least one boost inductor connected to the input of each phase of the active rectifier.

In a third aspect, there is provided a system comprising a power source configured to provide AC power; the motor drive as described above; and a motor. Such a system may be able to diagnose faults in insulation in any parts of the system.

In a fourth aspect, there is provided system comprising a plurality of motor drives, wherein at least one of the motor drives is a first motor drive, and is a motor drive as described above; a plurality of motors; and each of the plurality of motor drives is connected to at least one of the plurality of motors via a reconfiguration matrix.

The reconfiguration matrix may be further configured such that one of the plurality of motor drives may be connected to the output of the first motor drive, such that the first motor drive can test the insulation of any of the plurality of motor drives.

BRIEF DESCRIPTION OF THE DRAWINGS

Certain examples of the disclosure will now be described, by way of example only, with reference to the accompanying drawings, in which.

DETAILED DESCRIPTION

In order to address the above issues, the present invention provides a method, as well as a system that monitors the health of insulation in a power system. Whilst the examples described herein are described with reference to an aircraft's power districts and motor drive systems, as would be understood, the present invention may find use in other applications, and is not limited to its use within aircraft.

Figure 1:
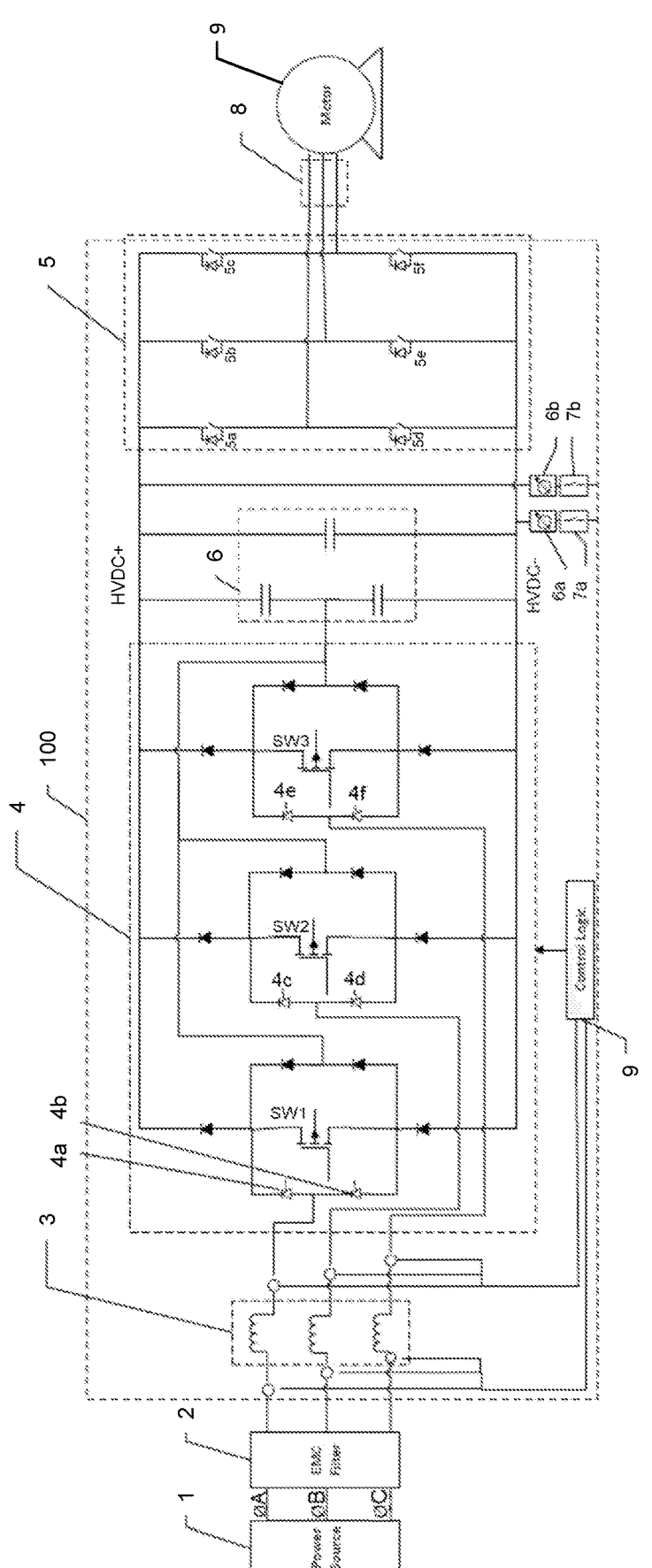
FIG. 1 is a schematic diagram of a motor drive system.

FIG. 1 shows an example motor drive system capable of monitoring the insulation at various points within the motor drive system.

The system comprises a power source 1 connected to an EMC filter 2, motor harness 8, and a motor 9 via a motor drive 100. The motor drive 100 comprises boost inductors 3 connected to each phase of the input power from power source 1, an active rectifier circuit 4, an output capacitor network circuit 6, a power bridge 5, current monitoring circuits 6a and 6b, and switches 7a and 7b. As would be appreciated, EMC filter 2 may be provided as part of the motor drive 100, or separate from the motor drive 100 as seen in the example of FIG. 1.

AC power from the power source 1 may be filtered by an EMC filter 2, and passed through boost inductors 3 connected to each phase of the input power source 1, to the active rectifier circuit 4, which is configured to output HVDC power to the power bridge 5. The active rectifier circuit 4 may be any suitable rectifier, such as a Vienna rectifier as seen in the example of FIG. 1. The rectifier may comprise, on each leg, a unidirectional switch SW1, SW2, SW3, bidirectional switches 4a, 4b, 4c, 4d, 4e, and 4f, as well as respective bridge diodes on each leg.

In normal operation, bidirectional switches 4a and 4b (such as thyristors) behave like standard diodes, although they may be turned off to prevent current flow from/to the power source. In this way, in case of fault in the inverter, the power bridge zero current crossing disconnect can be achieved, and a safe disconnection of the power source 1 may be actioned. In addition, the switches may reduce inrush current by turning them on at desired voltage levels, whilst operating as an active rectifier.

The output capacitor network circuit 6 is connected to the output of the active rectifier 5 and is configured to operate as local energy storage and voltage balancing for the power bridge 5, which in turn works as an inverter for providing AC output power for the motor harness 8 and motor 9. The active rectifier 4 is a boost topology with a unidirectional current flow. The voltage balance between the output capacitors network circuit 6 ensures correct operation of the active rectifier circuit 4, such that when any of the unidirectional switches is switched on (i.e. SW1, SW2 or SW3) the current on their respective phase will rise in its boost inductor 3, thereby storing energy and charging the output capacitors 6. As the switches open, the stored energy is released via their associated bridge diodes to the inverter 5.

A controller 9 (such as a PWM controller, a simple hysteresis controller or the like) may control the active rectifier so as to boost the voltage therein. For example, there may be two voltage loops in the controller, the main output voltage loop and the mid-point voltage loop. The output voltage error is multiplied by the line input voltage to produce the current demand. The output voltage is scaled to ½ and compared with the middle point voltage, and this mid-point error may be used to offset the actual line current. The difference between demand current and input current is fed to the controller to produce the required PWM output. In this way, the controller controls the rectifier and its switches (SW1-3, 4a-4f) so as to reach the desired HVDC+ and HVDC− voltage across its output.

The output voltage is then converted to AC power by inverter 5, for use by a motor 9. The inverter module 5 may be based on any switching devices, such as IGBTs, SiC or relays.

In order to determine whether there has been any degradation of the insulation at various points within the system, the voltage in the load may be boosted, as outlined above, to a desired level to determine the characteristics of the circuits at said level. For example, it may be desirable to determine whether there is any discharge at the level of normal operation. In modern aircraft systems, this can be in the excess of 1000v or higher. Therefore, in such systems, it is desirable to boost the voltage in the load to such a level, and then to decouple the load (i.e. disconnect all components from the power source).

By boosting the voltage in the load and reducing the current demand to zero, it is possible to turn off switches 4a to 4f. For example, these switches may be thyristors, which may be turned off when there is zero current demand. Once the load has been decoupled, then it is possible to determine whether there is any excessive leakage current which may be attributed to a failure in the insulation. In an ideal system, with perfect insulation, there would be no leakage, or at least limited leakage current from the load and system insulation. The voltage would therefore remain at or near the boosted level.

Therefore, in order to test for faults in the insulation of system 1, firstly, the DC link voltage is boosted to the desired level. In the example of FIG. 1, this may be achieved as described above.

Once the DC link voltage is boosted, the motor drive circuit may be isolated. This is achieved by turning off switches 4a-4f, which is possible during zero current demand from the power source 1.

At this point, when the DC link voltage has been boosted, and the motor drive circuit isolated, then it is possible to perform isolation tests.

In a standalone inverter (i.e. where the motor cables are fixed to the output of the motor drive 100), it is possible to test insulation of the motor drive first and then insulation of the load. For example, in the example of FIG. 1, the following tests may be performed:

TABLE 1

| Test No | Test objectives | Method |
| --- | --- | --- |
| 1 | Test the insulation of inverter top switches 5a, 5b, 5c and the whole of the active rectifier 4. | Turn OFF 5a, 5b, 5c, SW1, SW2, SW3 and 7b, Turn ON 5d, 5e, 5f and 7a, and disconnect the load (e.g. the motor windings and the harness). |
| 2 | Test the insulation of inverter bottom switches 5d, 5e, 5f, motor windings and harness 8. | Turn OFF 5d, 5e, 5f, SW1, SW2, SW3 and 7b, Turn ON 5a, 5b, 5c and 7a. |
| 3 | Test the whole of active rectifier 4. | Turn OFF 5a, 5b, 5c, 5d, 5e, 5f SW1, SW2, SW3 and 7a, Turn ON 7a and 7b. |

By providing the above tests, it is possible to determine not only the overall leakage within the system, but also the leakages of the inverter top switches, the inverter bottom switches, as well as the load (motor/motor harness) and the active rectifier. In this way, by providing only certain current paths in the floating system, it is possible to isolate certain parts of the system, and therefore identify the exact source of any leakages (and therefore, where there may exist a failure in the insulation).

In addition, the results of such tests may be combined to build a more accurate picture of the source of the leakage. For example, during test 1, if a certain degree of leakage is observed, and then during test 3, a similar amount of leakage is observed, it is likely that the source of leakage is the active rectifier as that is the common component tested in both tests. In test 3, there should be no HVDC+/− as all of the switches are off, so if any voltage is detected, it means that switches 4a to 4f (i.e. the active rectifier) are faulty. This can be confirmed if no (or at least very little) leakage is observed in test 2, which additionally tests the inverter bottom switches. In this way, if no leakage is seen in test 2, then the inverter bottom cannot be a source of the leakage. In such a way and as would be appreciated, by combining the results of these various tests, it is therefore possible to gain an idea of where the leakage is coming from.

The load may be disconnected in any known manner. For example, a multiplexer may be used to disconnect the load. Additionally/alternatively, the load may be disconnected by a physical removal or by isolating the load using switches.

During each test, the current is monitored by current monitoring circuits 6a, and 6b (whichever is connected), which are able to detect any partial discharge or excessive leakage occurs. It is possible to store those measurements and form predictions about remaining life or present state of insulation. Specifically, switches 7a and 7b may switch ON or OFF, thereby creating a reference point for the current to go through, and enabling the relevant monitoring circuit 6a and/or 6b to measure the current passing through.

Figure 2:
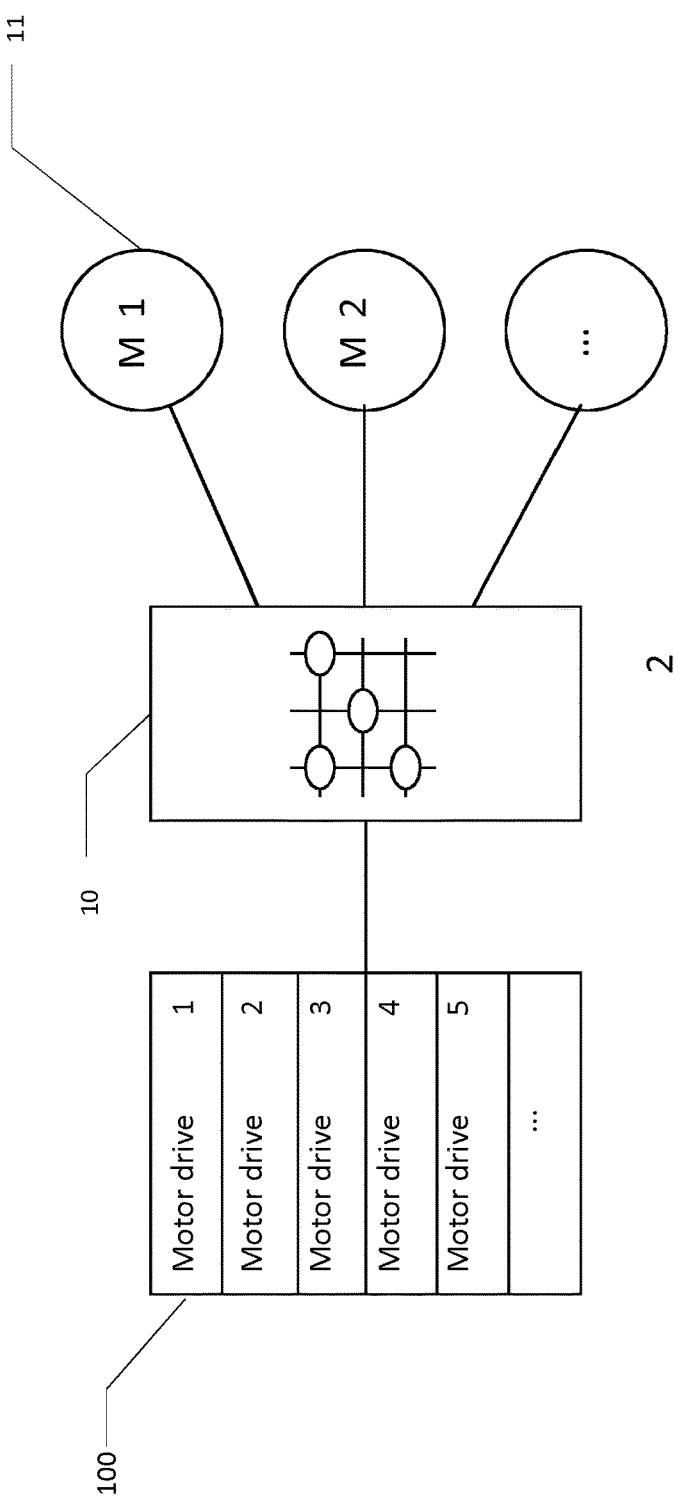
FIG. 2 is a schematic diagram of a power district, such as a power district of an aircraft.

FIG. 2 shows a power district architecture example where multiple motor drives 100 may be combined in parallel to drive one or more motors 11, depending on the system requirements. This is managed through a reconfiguration matrix 10 (for example, a multiplexer) to connect the required motor(s) 11 to the required motor drive(s) 100, thereby allowing each motor drive 100 to drive any one of the motors 11, M1, M2 etc. Such a power district may be found in, for example, an aircraft.

The insulation testing method set out above may still be used in this setup, and a single motor drive can test all the connected motors. For example, motor drive 1 can have the circuit configuration 100 shown in FIG. 1. Following the above steps above, test 2 (shown in Table 1 above) can be used to test all of the remaining motor drives, along with all the motors 11 and their associated harnesses with only a single detection circuit 6a, 6b. In this way, whilst the reconfiguration matrix 10 may be is used to multiplex loads (i.e. motors) during normal operation, it may be used to test other insulation within the system. For example, the insulation testing motor drive 1 (having a configuration 100 as shown in FIG. 1) can be used as an "insulation tester" and connect to the outputs of motor drive 2 via the reconfiguration matrix 10. The connection of another motor drive to the outputs of motor drive 1 allows for the insulation of motor drive 2 (or any motor load within the system) to be checked. It is also possible to test insulation of other power blades in the power rack. As the leakage of the inverter of the motor drive can be tested in isolation, then it is possible to attribute any further leakage to the load that is connected by the multiplexer.

Such a method allows the system to monitor the health of the insulation in the power district as a part of start-up or diagnostic routine. For example, the above method may be performed upon a regular start-up of an aircraft, in order to accurately track any potential leakage, and how it might be developing over time. This data may be used during a scheduled repair, or used to prompt the scheduling of a repair to fix the identified issues. Additionally, or alternatively, such a routine may be performed during maintenance in order to determine whether certain components in a motor drive, or within a motor should be serviced.

By monitoring partial discharge, it is possible to assess whether there has been any degradation of the insulation on a certain channel. If partial discharge is detected, then a scheduled repair may planned be to address the source of the partial discharge, before it results in accelerated ageing of the insulation. Additionally or alternatively, in the case where partial discharge is detected at a particularly high voltage, then a decision may be made to reduce the operating voltages to a safe level where discharge no longer occurs, until a repair may be made.

By effectively monitoring the health of the insulation of a power district, whether that be as part of aircraft start-up or diagnostic routine, it is possible to mitigate the issues outlined above by detecting degradation of insulation before it results in total failure. Failure of insulation will increase leakage current to a very high level, which may eventually be detected by the aircraft power distribution system (GCI), where the faulty power branch will be disconnected and backup functionality will be deployed. This reduces functionality which can lead to a worsened customer experience, and result in unscheduled maintenance. At this point, it would otherwise be necessary to investigate during maintenance to identify the cause of the issues. However, the circuits and methods outlined herein would allow for a single weight neutral test routine to be used to monitor the state of the insulation of a standalone motor drive or whole power district.

Further, the method considered herein may be used during the design of aircraft power districts, for example to optimize isolation thickness in cables. During design, by knowing that the state of the isolation is going to be monitored, less isolation can be used, which can in turn help to manage the heating effects of bundled wires.

Such a method provides the ability to carry out diagnostic and prognostics for insulation in increasingly challenging environments for a selected load, and the ability to detect failures and identify its origins before they occur naturally helps in improving safety. This may be implemented with a cheap add on circuit that is capable of detecting leakage current and partial discharge, and which is also compatible for testing all elements of power district scalable systems. By monitoring the state of the insulation, and thereby by detecting when there is an appreciable amount of degradation in the insulation, potential faults may be identified at their exact location and addressed before they become critical. This reduces down time, and unexplained aircraft protection trips, which can take substantial amount of time to identify the source of the failure. Further, in an emergency, there may be provided a safe AC disconnect in case of fault. In addition, the active rectifier can provide lossless and fault tolerant inrush current management.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

The invention claimed is:

1. A method for monitoring insulation in a power system comprising a motor drive configured to provide AC power from a power source to power a motor, the method comprising:

boosting a DC link voltage of an inverter of the motor drive by an active rectifier, the active rectifier converting the AC power from the power source to DC power for the inverter;

isolating the motor drive from the power source;

performing at least one isolation test by providing a current path through components of the motor drive; and monitoring the current during each isolation test to detect partial discharge or excessive leakage from the current path, thereby indicating that there exist one or more defect in the insulation in the current path;

wherein the step of isolating the motor drive from the power source comprises:

turning off bidirectional switches on each leg of the active rectifier during a zero current demand resulting from the boosting of the DC link voltage.

2. The method of claim 1, wherein the step of boosting the DC link voltage comprises:

controlling the active rectifier to perform a boost operation, thereby converting the AC power from the power source at its input to high voltage DC power at its output, thereby providing a boosted DC link voltage for the inverter of the motor drive.

3. The method of claim 1, further comprising:

storing the monitored current during each isolation test; and using the stored current to predict the remaining life or present state of the insulation of the current path associated with each isolation test.

4. The method of claim 1, wherein the step of monitoring the current during each isolation test comprises:

measuring the current on a low voltage DC rail, HVDC−, by closing a first switch thereby allowing current to pass through a first current monitoring circuit, and measuring the current on a high voltage DC rail, HVDC+, by closing a second switch thereby allowing current to pass through a second current monitoring circuit.

5. The method of claim 1, wherein the step of performing at least one isolation test comprises at least one of:

testing the insulation of the inverter top switches and the active rectifier;

testing the insulation of inverter bottom switches, windings of the motor and the harness of the winding; and testing the insulation of the active rectifier.

6. The method of claim 1, wherein the motor drive is a first motor drive of a plurality of motor drives, and each of the plurality of motor drives is connected at least one of a plurality of motors via a reconfiguration matrix, and wherein the reconfiguration matrix connects a desired motor drive of the plurality of motor drives to the output of the first motor drive such that the insulation of the desired motor drive may be tested.

7. A motor drive for performing the method of claim 1, the motor drive comprising:

the active rectifier, wherein the active rectifier is configured to connect to the power source at its input, and provide DC power along a high voltage DC rail, HVDC+, and a low voltage DC rail, HVDC−, at its output;

the inverter, wherein the inverter is configured to convert DC power across HVDC+ and HVDC− to an AC power output;

an output capacitor network circuit connected to the output of the active rectifier, the capacitor network circuit being configured to operate as local energy storage and voltage balancing for the inverter;

a first current monitoring circuit connected to HVDC−; and a second current monitoring circuit connected to HVDC+.

8. The motor drive of claim 7, wherein the inverter module is based on IGBTs, Mosfet SiC, Si devices or relays.

9. The motor drive of claim 7, further comprising:

an EMC filter configured to filter input DC power.

10. The motor drive of claim 7, further comprising:

a first switch in series with the first current monitoring circuit, and a second switch in series with the second current monitoring circuit.

11. The motor drive of claim 7, further comprising:

at least one boost inductor connected to the input of each phase of the active rectifier.

12. A system comprising:

a power source configured to provide AC power;

the motor drive of claim 7 connected to the power source to receive the AC power; and a motor connect to the motor drive.

13. A system comprising a plurality of motor drives, wherein at least one of the motor drives is a first motor drive, and is a motor drive as claimed in claim 7;

a plurality of motors;

wherein each of the plurality of motor drives is connected at least one of the plurality of motors via a reconfiguration matrix.

14. The system of claim 13, wherein the reconfiguration matrix is further configured such that one of the plurality of motor drives may be connected to the output of the first motor drive, such that the first motor drive can test the insulation of any of the plurality of motor drives.

* * * * *